(12) United States Patent
Fukuoka et al.

(10) Patent No.: US 6,803,120 B2
(45) Date of Patent: Oct. 12, 2004

(54) ORGANIC ELECTROLUMINESCENCE DEVICE EMITTING WHITE LIGHT

(75) Inventors: Kenichi Fukuoka, Chiba-ken (JP); Sanae Tagami, Chiba-ken (JP); Chishio Hosokawa, Chiba-ken (JP)

(73) Assignee: Idemitsu Kosan Co., Ltd., Tokyo (JP)

( * ) Notice: Subject to any disclaimer, the term of this patent is extended or adjusted under 35 U.S.C. 154(b) by 119 days.

(21) Appl. No.: 09/749,749

(22) Filed: Dec. 28, 2000

(65) Prior Publication Data

US 2002/0168544 A1 Nov. 14, 2002

(30) Foreign Application Priority Data

Dec. 28, 1999 (JP) .......................................... 11/372514
Oct. 27, 2000 (JP) ....................................... 2000/328726

(51) Int. Cl.$^7$ .............................................. H05B 33/14
(52) U.S. Cl. ...................... 428/690; 428/917; 313/504; 313/506
(58) Field of Search ................................ 428/690, 917; 313/502, 503, 504, 506, 509; 257/101

(56) References Cited

U.S. PATENT DOCUMENTS 5,126,214 A * 6/1992 Tokailin et al. ............. 428/690
6,285,039 B1 * 9/2001 Kobori et al. ................. 257/40
6,447,934 B1 * 9/2002 Suzuki et al. ............... 428/690

FOREIGN PATENT DOCUMENTS

JP         10-168445          6/1998
JP         11-329734        * 11/1999

OTHER PUBLICATIONS

Dicker et al. "Emission Properties of a Molecularly Doped Highly Fluorescent Polymer", Synthetic Metals, 102 (1999) p. 873–874.*
Official Action isssued in Counterpart Chinese Patent Application, Application No. 00804375.2, Date of Notification: Nov. 21, 2003, Applicant: Idemitsu Kosan Co., LTD.

* cited by examiner

Primary Examiner—Dawn Garrett
(74) Attorney, Agent, or Firm—Oblon, Spivak, McClelland, Maier & Neustadt, P.C.

(57) ABSTRACT

An organic electroluminescence device emitting white light which emits white light and exhibits properties sufficient for practical applications, i.e., a high efficiency of light emission and a long life, is provided. The organic electroluminescence device emitting white light comprises a pair of electrodes and a layer of a light emitting medium disposed between the pair of electrodes, wherein the layer of a light emitting medium comprises a light emitting material emitting blue light and a fluorescent compound having at least one structure selected from a fluoranthene skeleton structure, a pentacene skeleton structure and a perylene skeleton structure.

27 Claims, 2 Drawing Sheets

ORGANIC ELECTROLUMINESCENCE DEVICE EMITTING WHITE LIGHT

TECHNICAL FIELD

The present invention relates to an organic electroluminescence device (hereinafter, electroluminescence will be referred to as EL) emitting while light and, more particularly, to an organic EL device having a high efficiency and a long life and emitting white light.

BACKGROUND ART

Electroluminescence devices which utilize electroluminescence show high self-distinguishability because of the self-emission and are excellent in impact resistance because they are completely solid devices. Therefore, electroluminescence devices have been attracting attention for application as light emitting devices in various types of display apparatus.

The electroluminescence devices include inorganic electroluminescence devices in which an inorganic compound is used as the light emitting material and organic electroluminescence devices in which an organic compound is used as the light emitting material. Organic electroluminescence devices have been extensively studied for practical application as a light emitting device of the next generation because the applied voltage can be decreased to a large extent, the size of the device can be reduced easily, consumption of electric power is small, planar light emission is possible and three primary colors are easily emitted.

As for the construction of the organic electroluminescence device, the basic construction comprises an anode/an organic light emitting layer/a cathode. Constructions having a hole injecting and transporting layer or an electron injecting layer suitably added to the basic construction are known. Examples of such construction include the construction of an anode/a hole injecting and transporting layer/an organic light emitting layer/a cathode and the construction of an anode/a hole injecting and transporting layer/an organic light emitting layer/an electron injecting layer/a cathode.

Recently, organic EL devices for display apparatuses have been developed actively. In particular, a device which can emit white light is the major target of the development. An organic EL device emitting white light can be used as the light source for single color displays and back light. Moreover, an organic EL device emitting white light can be used for full color display when color filters are attached to a display apparatus.

For examples, an organic EL device emitting white light is disclosed in the U.S. Pat. No. 5,503,910, in which a laminate of a light emitting layer emitting blue light and a light emitting layer emitting green light is used as the layer of a light emitting medium and a fluorescent compound emitting red light is added to the layer of a light emitting medium. An organic EL device emitting white light is disclosed in the U.S. Pat. No. 5,683,828, which has a layer of a light emitting medium obtained by adding a complex compound containing boron which is a fluorescent compound emitting red light to a light emitting layer emitting bluish green light. An organic EL device emitting white light is disclosed in Japanese Patent Application Laid-Open No. Heisei 10(1998)-308278, which has a light emitting medium obtained by adding a benzothioxanthene derivative which is a fluorescent compound emitting red light to a light emitting layer emitting bluish green light.

However, the device disclosed in the U.S. Pat. No. 5,503,910 has an efficiency of light emission as low as about 1 lumen/W and a life as short as about 1,000 hours although white light is emitted. The device disclosed in the U.S. Pat. No. 5,683,828 has an efficiency of light emission as low as about 2.6 cd/A although white light is emitted. The device disclosed in Japanese Patent Application Laid-Open No. Heisei 10(1998)-308278 has an efficiency of light emission as low as about 1 lumen/W although white light is emitted. No devices sufficiently satisfy the requirements for practical application with respect to the efficiency of light emission and the life.

DISCLOSURE OF THE INVENTION

The present invention has an object of providing an organic EL device emitting white light which emits white light and exhibits properties sufficient for practical applications, i.e., a high efficiency of light emission of 5 lumen/W or greater and 5 cd/A or greater and a long life of 10,000 hours or longer.

As the result of extensive studies by the present inventors to achieve the above object, it was found that, when the layer of a light emitting medium comprises a light emitting material emitting blue light and a fluorescent compound having at least one structure selected from the fluoranthene skeleton structure, the pentacene structure and the perylene structure, an organic EL device comprising this layer of a light emitting medium disposed between a pair of electrodes has a high efficiency of light emission and a long life and emits white light. The present invention has been completed based on this knowledge.

The present invention provides an organic electroluminescence device emitting white light which comprises a pair of electrodes and a layer of a light emitting medium disposed between the pair of electrodes, wherein the layer of a light emitting medium comprises a light emitting material emitting blue light and a fluorescent compound having at least one structure selected from a fluoranthene skeleton structure, a pentacene skeleton structure and a perylene skeleton structure.

THE MOST PREFERRED EMBODIMENT TO CARRY OUT THE INVENTION

Figure 1:
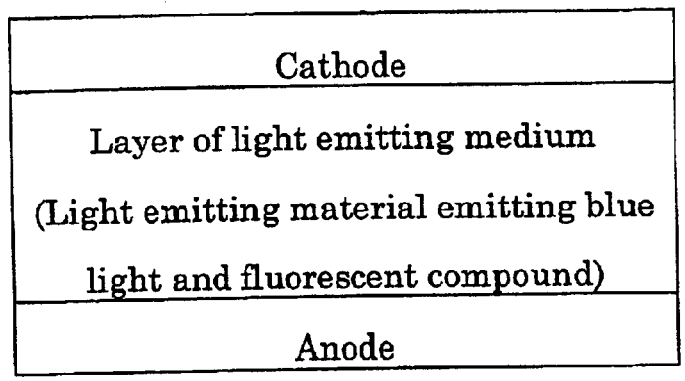
FIG. 1 shows an examples of the construction of the organic EL device emitting white light of the present invention.

The organic EL device of the present invention has, as shown in FIG. 1, a construction comprising a pair of electrodes and a layer of a light emitting medium disposed between the pair of electrodes.

The layer of a light emitting medium comprises a light emitting material emitting blue light and a fluorescent compound having at least one structure selected from the fluoranthene skeleton structure, the pentacene skeleton structure and the perylene skeleton structure.

The layer of a light emitting medium comprises organic compounds as the main components thereof and is a medium providing a field for transportation and recombination of electrons and holes which are injected from the electrodes. This layer may comprise a single layer or a plurality of layers. When the layer of a light emitting medium comprises a plurality of layers, the layers comprised in the layer of a light emitting medium include a hole injecting layer, a hole transporting layer, a light emitting layer and an electron transporting layer.

In the present invention, various constructions of the layers can be used.

(1) In the first construction, similarly to the construction shown in FIG. 1, the layer of a light emitting medium comprises light emitting layer A which comprises the light emitting material emitting blue light and the fluorescent compound.

The layer of a light emitting medium may comprise a light emitting layer emitting blue light and light emitting layer A described above.

Figure 2:
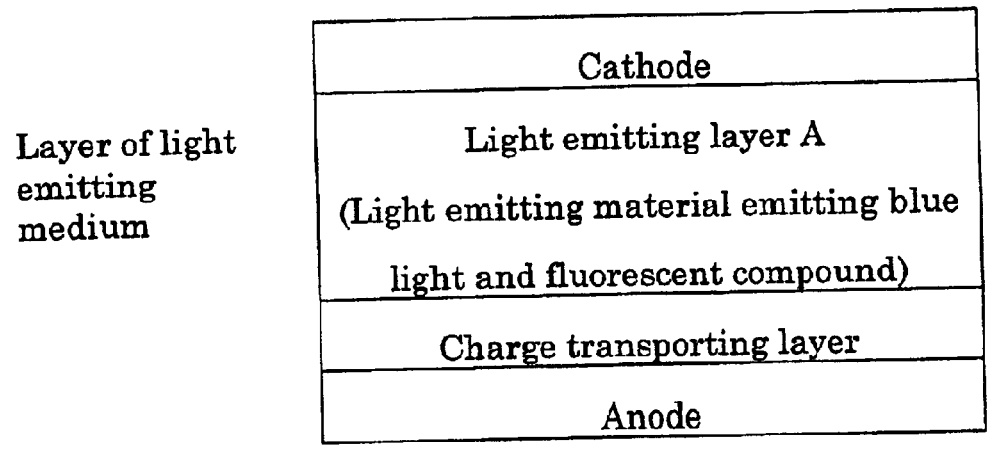
FIG. 2 shows another examples of the construction of the organic EL device emitting white light of the present invention.

In this construction, the layer of a light emitting medium may comprise light emitting layer A and organic layers other than light emitting layer A. For example, as shown in FIG. 2, light emitting layer A may be laminated with a charge transporting layer such as a hole injecting layer, a hole transporting layer and an electron transporting layer. The charge transporting layer and light emitting layer A may be laminated in the order reverse to that shown in FIG. 2. Layers other than the charge transporting layers such as an electron barrier layer, a hole barrier layer, an organic semiconductive layer, an inorganic semiconductive layer and a layer for improvement of adhesion may also be contained in the laminate.

It is preferable that light emitting layer A described above comprises the light emitting material emitting blue light and a fluorescent dopant emitting blue light and/or that the light emitting layer emitting blue light comprises the light emitting material emitting blue light and a fluorescent dopant emitting blue light.

Figure 3:
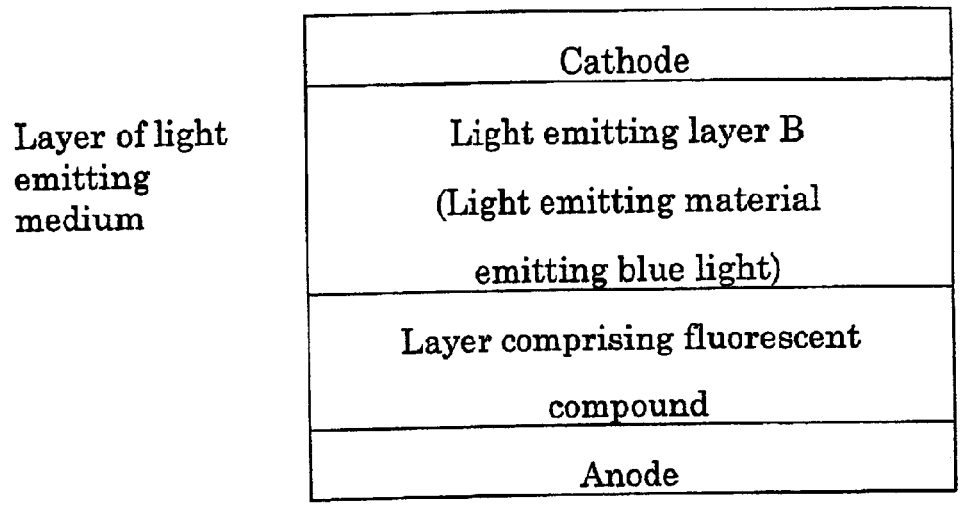
FIG. 3 shows another examples of the construction of the organic EL device emitting white light of the present invention.

(2) In the second construction, as shown in FIG. 3, the layer of a light emitting medium comprises light emitting layer B comprising the light emitting material emitting blue light and a layer comprising the fluorescent compound. The layer comprising the fluorescent compound and light emitting layer B may be laminated in the order reverse to that shown in FIG. 3. Charge transporting layers and other layers such as an electron barrier layer, a hole barrier layer, an organic semiconductive layer, an inorganic semiconductive layer and a layer for improvement of adhesion may be disposed between the layer comprising the fluorescent compound or light emitting layer B and the electrodes.

In this construction, it is preferable that light emitting layer B is a light emitting layer emitting blue light, the layer comprising the fluorescent compound is a light emitting layer which comprises a light emitting material and the fluorescent compound and emits yellow, orange or red light and the light emitting layer emitting blue light comprises a light emitting material emitting blue light and a dopant emitting blue light. As the light emitting material comprised in the layer comprising the fluorescent compound, a light emitting material emitting blue or green light is preferable.

Figure 4:
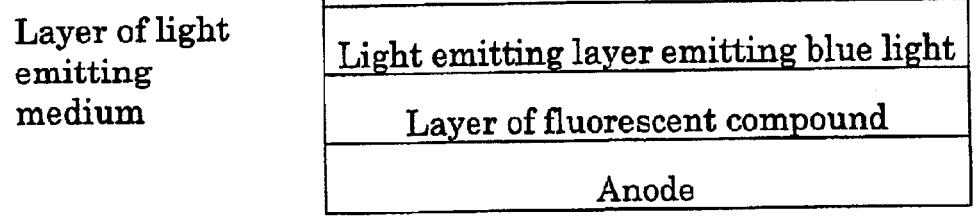
FIG. 4 shows another examples of the construction of the organic EL device emitting white light of the present invention.

(3) In the third construction, as shown in FIG. 4, the layer of light emitting medium comprises a light emitting layer emitting blue light and a layer of the fluorescent compound. The layer of the fluorescent compound and the light emitting layer emitting blue light may be laminated in the order reverse to that shown in FIG. 4. Charge transporting layers and other layers such as an electron barrier layer, a hole barrier layer, an organic semiconductive layer, an inorganic semiconductive layer and a layer for improvement of adhesion may be disposed between the layer of the fluorescent compound or the light emitting layer emitting blue light and the electrodes.

The layer of the fluorescent compound is a layer which contains 20 to 100% by weight of the fluorescent compound and emits yellow, orange or red light. In the above construction, it is preferable that the light emitting layer is a light emitting layer emitting blue light and the layer of the fluorescent compound is a light emitting layer which comprises the fluorescent compound and emits yellow, orange or red light. It is more preferable that the light emitting layer emitting blue light comprises the light emitting material emitting blue light and a fluorescent dopant emitting blue light. As the light emitting material comprised in the layer of the fluorescent compound, a light emitting material emitting blue or green light is preferable.

As described above, in the first to third constructions, light emitting layer A, light emitting layer B and the light emitting layer emitting blue light may comprise the light emitting material emitting blue light and the fluorescent dopant emitting blue light so that the property to emit blue light is enhanced. The fluorescent dopant emitting blue light is a compound which is added to enhance the property of the light emitting layer. Preferable examples of the fluorescent dopant emitting blue light include styrylamines, styryl compounds substituted with an amine and compounds having a condensed aromatic ring. The fluorescent dopant emitting blue light is added in an amount of 0.1 to 20% by weight. It is preferable that the ionization energy of the fluorescent dopant emitting blue light is smaller than the ionization energy of the main components so that the property for charge injection is improved.

The layer of a light emitting medium described above may comprise a hole transporting material or a hole injecting material.

The layer of a light emitting medium described above may comprise a hole transporting layer or a hole injecting layer.

The layer of a light emitting medium described above may comprise an electron transporting material or an electron injecting material.

The layer of a light emitting medium described above may comprise an electron transporting layer or an electron injecting layer.

It is preferable that the layer of a light emitting medium contacting the anode contains an oxidizing agent. As the oxidizing agent contained in the layer of a light emitting medium, an oxidizing agent having the electron-accepting property or an electron acceptor is preferable. Preferable examples of the oxidizing agent include Lewis acids, various types of quinone derivatives, dicyanoquinodimethane derivatives and salts formed from aromatic amines and Lewis acids. Preferable examples of the Lewis acid include iron chloride, antimony chloride and aluminum chloride.

It is preferable that the organic light emitting medium contacting the cathode contains a reducing agent. Preferable examples of the reducing agent include alkali metals, alkaline earth metals, alkali metal oxides, alkaline earth metal oxides, oxides of rare earth elements, alkali metal halides, alkaline earth metal halides, halides of rare earth elements and complex compounds formed from alkali metals and aromatic compounds. Preferable examples of the alkali metal include Cs, Li, Na and K.

A layer of an inorganic compound may be disposed between at least one of the electrodes and the layer of a light emitting medium. Preferable examples of the inorganic compound used in the layer of an inorganic compound include various types of oxides, nitrides and oxide nitrides such as alkali metal oxides, alkaline earth metal oxides, oxides of rare earth elements, alkali metal halides, alkaline earth metal halides, halides of rare earth elements, $SiO_x$, $AlO_x$, $SiN_x$, SiON, AlON, $GeO_x$, $LiO_x$, LiON, $TiO_x$, TiON, $TaO_x$, TaON, $TaN_x$ and C. In particular, as the component of the layer contacting the anode, $SiO_x$, $AlO_x$, $SiN_x$, SiON, AlON, $GeO_x$ and C are preferable since a stable interface layer for injection is formed. As the component of the layer contacting the cathode, LiF, $MgF_2$, $CaF_2$ and NaF are preferable.

Examples of the fluorescent compound having at least one structure selected form the fluoranthene skeleton structure and the perylene skeleton structure, which is used in the present invention, include compounds represented by general formulae [1'], [2'] and [1] to [18] shown in the following.

$$X=Z=Y \qquad [1']$$

$$X=W \qquad [2']$$

In the above formulae, Z represents a tetravalent group represented by any of the following general formulae (1) to (6):

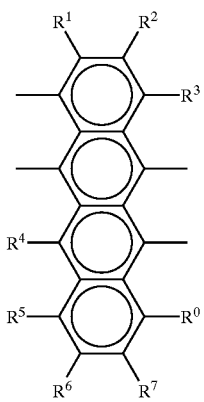

(1)

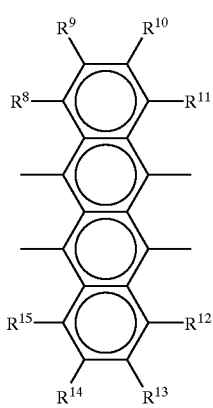

(2)

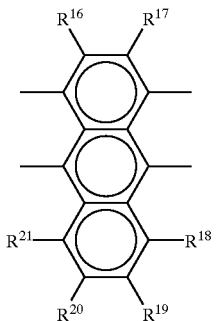

(3)

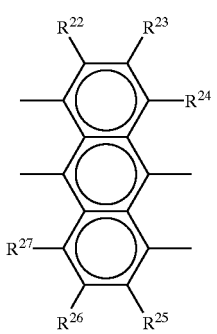

(4)

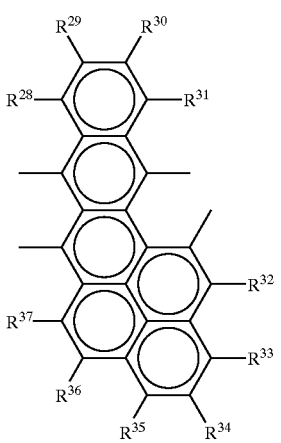

(5)

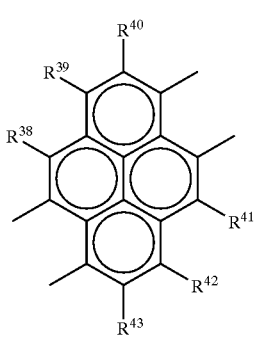

(6)

X and Y each independently represent a divalent group represented by any of the following general formulae (7) to (10):

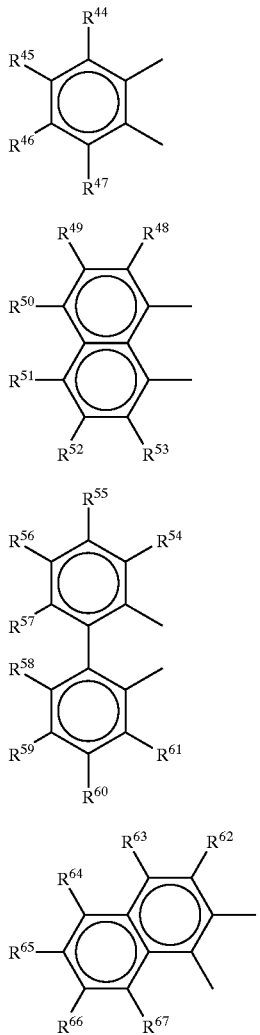

(7)
(8)
(9)
(10)

and

W represents a divalent group represented by any of the following general formulae (11) to (13):

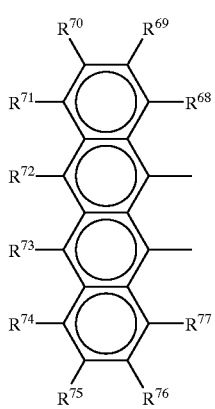

(11)

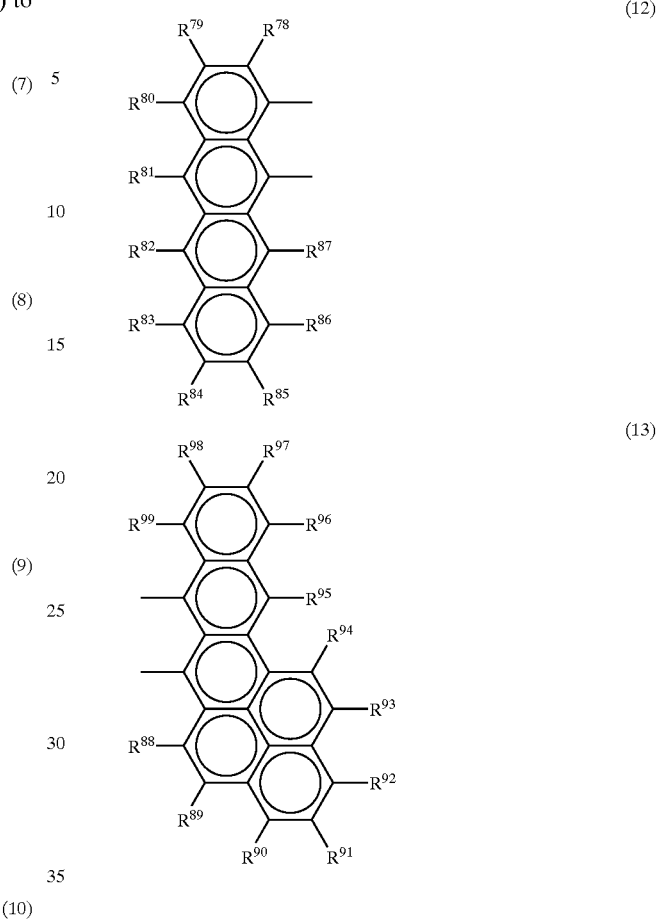

(12)
(13)

In the above general formulae (1) to (13), $R^0$ to $R^{99}$ each independently represent hydrogen atom, a halogen atom, cyano group, a substituted or unsubstituted alkyl group having 1 to 20 carbon atoms, a substituted or unsubstituted cycloalkyl group having 6 to 10 carbon atoms, a substituted or unsubstituted alkoxy group having 1 to 20 carbon atoms, a substituted or unsubstituted amino group having 1 to 30 carbon atoms, a substituted or unsubstituted aryloxy group having 6 to 20 carbon atoms, a substituted or unsubstituted alkoxycarbonyl group having 1 to 20 carbon atoms, a substituted or unsubstituted aralkyl group having 6 to 30 carbon atoms, a substituted or unsubstituted aromatic hydrocarbon group having 6 to 30 carbon atoms or a substituted or unsubstituted heterocyclic group having 5 to 30 carbon atoms, and adjacent groups represented by $R^0$ to $R^{99}$ may be bonded to each other to form a cyclic structure.

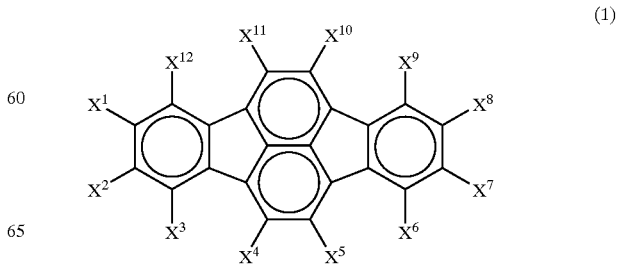

(1)

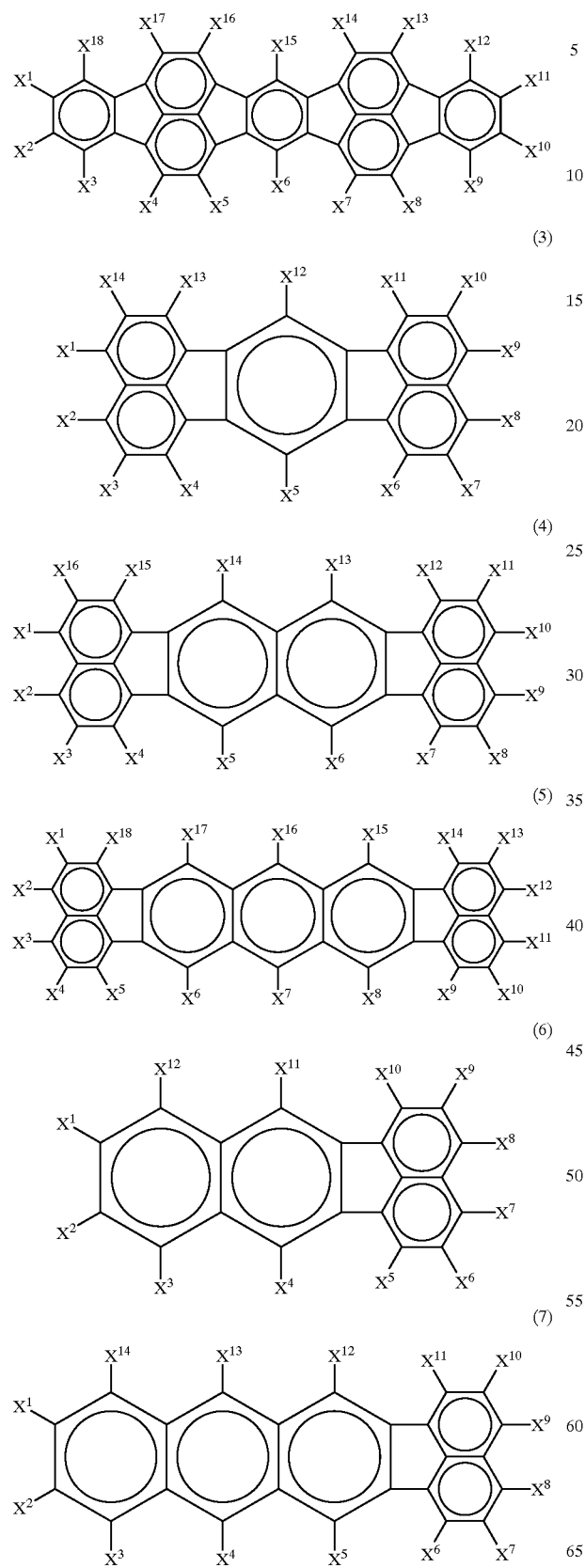
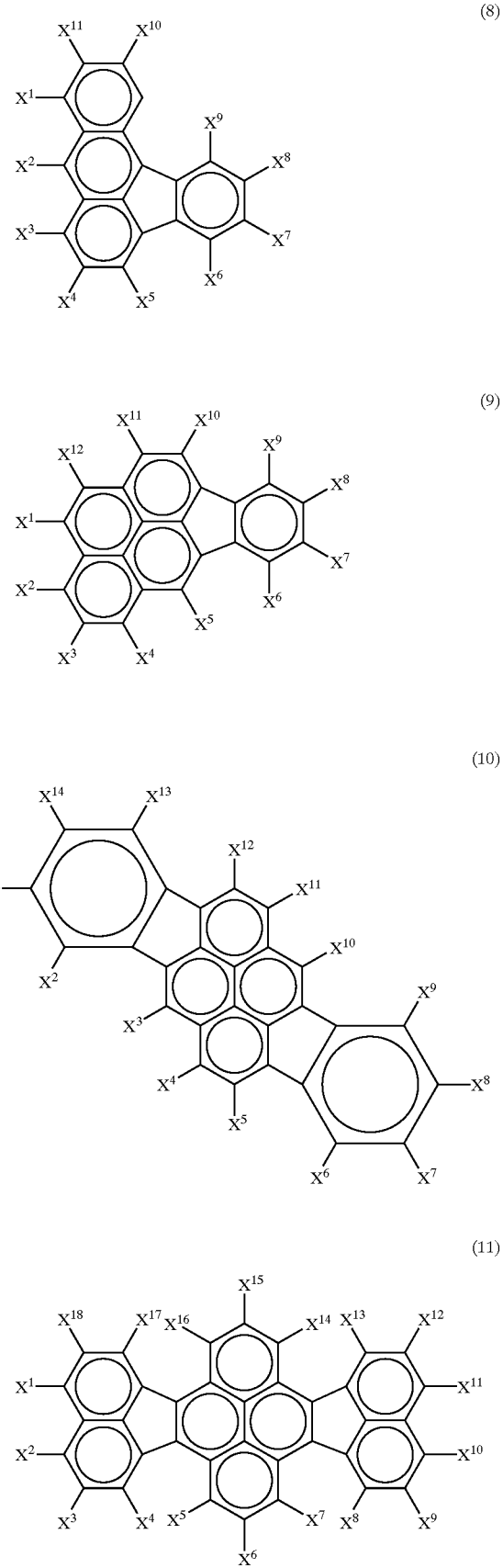

(12)

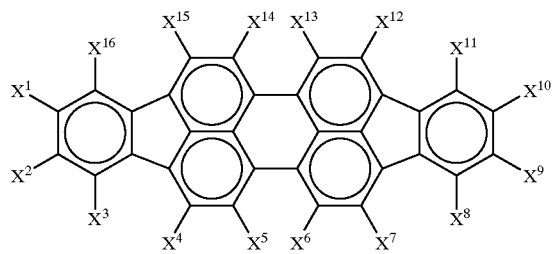

(13)

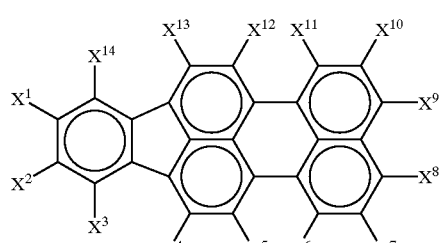

(14)

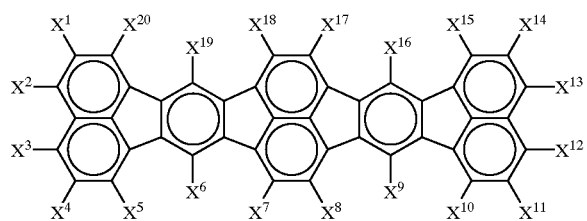

(15)

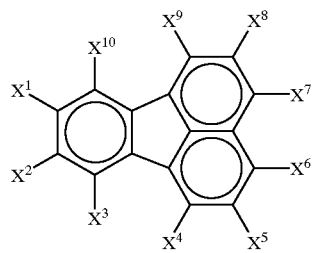

(16)

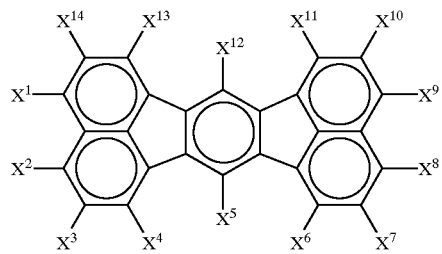

In the above general formulae [1] to [16], $X^1$ to $X^{20}$ each independently represent hydrogen atom, a linear, branched or cyclic alkyl group having 1 to 20 carbon atoms, a linear, branched or cyclic alkoxy group having 1 to 20 carbon atoms, a substituted or unsubstituted aryl group having 6 to 30 carbon atoms, a substituted or unsubstituted aryloxy group having 6 to 30 carbon atoms, a substituted or unsubstituted arylamino group having 6 to 30 carbon atoms, a substituted or unsubstituted alkylamino group having 1 to 30 carbon atoms, a substituted or unsubstituted arylalkylamino group having 7 to 30 carbon atoms or a substituted or unsubstituted alkenyl group having 8 to 30 carbon atoms, adjacent substituents and adjacent groups represented by $X^1$ to $X^{20}$ may be bonded to each other to form a cyclic structure, and, when the adjacent substituents are aromatic groups, the substituents may the same group.

It is preferable that the compounds represented by general formulae [1] to [16] have an amino group or an alkenyl group.

[17]

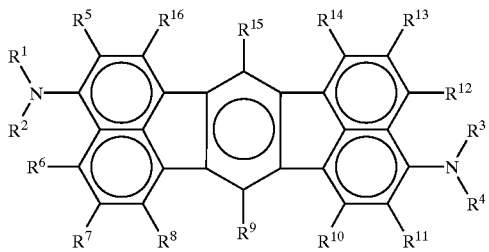

[18]

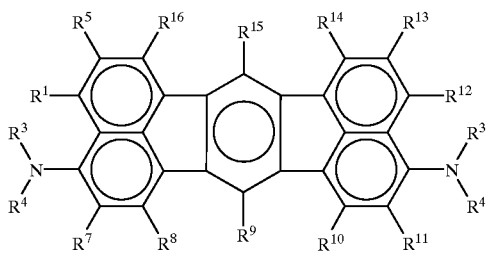

In the above general formulae [17] and [18], $R^1$ to $R^4$ each independently represent an alkyl group having 1 to 20 carbon atoms, a substituted or unsubstituted aryl group having 6 to 30 carbon atoms, any of a pair of groups represented by $R^1$ and $R^2$ and a pair of groups represented by $R^3$ and $R^4$ may be bonded to each other through a carbon-carbon bond, —O— or —S—, $R^5$ to $R^{16}$ each independently represent hydrogen atom, a linear, branched or cyclic alkyl group having 1 to 20 carbon atoms, a linear, branched or cyclic alkoxy group having 1 to 20 carbon atoms, a substituted or unsubstituted aryl group having 6 to 30 carbon atoms, a substituted or unsubstituted aryloxy group having 6 to 30 carbon atoms, a substituted or unsubstituted arylamino group having 6 to 30 carbon atoms, a substituted or unsubstituted alkylamino group having 1 to 30 carbon atoms, a substituted or unsubstituted arylalkylamino group having 7 to 30 carbon atoms or a substituted or unsubstituted alkenyl group having 8 to 30 carbon atoms, and adjacent substituents and adjacent groups represented by $R^5$ to $R^{16}$ may be bonded to each other to form a cyclic structure. It is preferable that at least one of the substituents represented by $R^5$ to $R^{16}$ in the above general formulae has an amine or an alkenyl group.

Examples of the fluorescent compound having at least one pentacene skeleton structure, which is used in the present invention, include compounds represented by formulae [19] and [20] shown in the following.

[19]

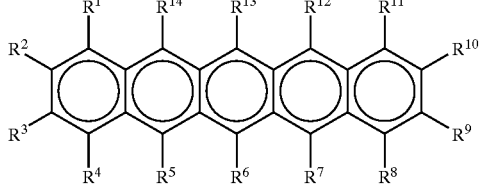

In the above general formula [19], $R^1$ to $R^{14}$ each independently represents hydrogen atom, an alkyl group having 1 to 10 carbon atoms, an aryloxy group having 6 to 20 carbon atoms, an arylalkyl group having 6 to 20 carbon atoms, an aryl group having 6 to 30 carbon atoms, an arylamino group having 6 to 30 carbon atoms, an alkylamino group having 2 to 20 carbon atoms or an arylalkylamino group having 6 to 30 carbon atoms, the groups represented by $R^1$ to $R^{14}$ may be substituted, and at least one pair of groups represented by $R^1$ to $R^{14}$ which are adjacent to each other are not hydrogen atom and form a cyclic structure.

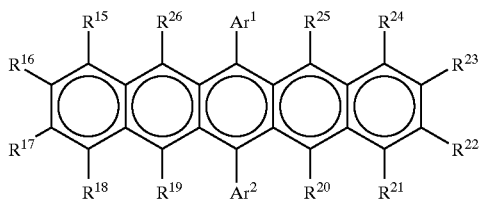

[20]

In the above general formula [20], $R^{15}$ to $R^{26}$ each independently represent hydrogen atom, an alkyl group having 1 to 10 carbon atoms, an aryloxy group having 6 to 20 carbon atoms, an arylalkyl group having 6 to 20 carbon atoms, an aryl group having 6 to 30 carbon atoms, an arylamino group having 6 to 30 carbon atoms, an alkylamino group having 2 to 20 carbon atoms or an arylalkylamino group having 6 to 30 carbon atoms, the groups represented by $R^{15}$ to $R^{26}$ may be substituted, at least one pair of groups represented by $R^{15}$ to $R^{26}$ which are adjacent to each other are not hydrogen atom and form a cyclic structure, and $Ar^1$ and $Ar^2$ each represent a substituted or unsubstituted aryl group having 6 to 30 carbon atoms or a substituted or unsubstituted heterocyclic group having 5 to 30 carbon atoms.

It is preferable that the fluorescent compound having the fluoranthene skeleton structure or the perylene skeleton structure has an electron-donating group so that a high efficiency and a long life are achieved. As the electron-donating group, substituted and unsubstituted arylamino groups are preferable.

It is preferable that the fluorescent compound having the fluoranthene skeleton structure, the perylene skeleton structure or the pentacene skeleton structure has 5 or more condensed rings and more preferably 6 or more condensed rings since the fluorescent compound having this structure has the peak wavelength of fluorescence at 540 to 650 nm and the light emitted from the light emitting material emitting blue light and the light emitted from the fluorescent compound are combined so as to emit white light.

It is preferable that the fluorescent compound has a plurality of the fluoranthene skeleton structures or a plurality of the perylene skeleton structure since the emitted light is in the region of yellow to red. It is more preferable that the fluorescent compound has an electron-donating group and the fluoranthene skeleton structure or the perylene skeleton structure and has the peak wavelength of fluorescence at 540 to 650 nm.

It is preferable that the light emitting material emitting blue light used in the present invention is a styryl derivative, an anthracene derivative or an aromatic amine.

It is preferable that the styryl derivative described above is at least one compound selected from distyryl derivatives, tristyryl derivatives, tetrastyryl derivatives and styrylamine derivatives.

It is preferable that the anthracene derivative described above is a compound having the phenylanthracene skeleton structure.

It is preferable that the aromatic amine described above is a compound having 2 to 4 nitrogen atoms which are substituted with an aromatic group and more preferably a compound having 2 to 4 nitrogen atoms which are substituted with an aromatic group and having at least one alkenyl group.

Examples of the styryl derivative and the anthracene derivative described above include compounds represented by general formulae [i] to [v] shown bellow. Examples of the aromatic amine described above include compounds represented by general formulae [vi] and [vii] shown below;

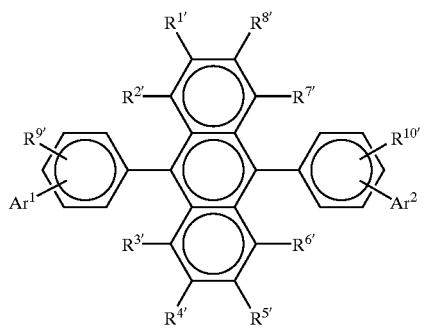

[i]

In the above general formula, $R^{1'}$ to $R^{10'}$ each independently represent hydrogen atom, a halogen atom, cyano group, nitro group, a substituted or unsubstituted alkyl group having 1 to 20 carbon atoms, a substituted or unsubstituted alkoxy group having 1 to 20 carbon atoms, a substituted or unsubstituted aryloxy group having 6 to 30 groups, a substituted or unsubstituted alkylthio group having 1 to 20 carbon atoms, a substituted or unsubstituted arylthio group having 6 to 30 carbon atoms, a substituted or unsubstituted arylalkyl group having 7 to 30 carbon atoms, an unsubstituted single ring group having 5 to 30 carbon atoms, a substituted or unsubstituted condensed multi-ring group having 10 to 30 carbon atoms or a substituted or unsubstituted heterocyclic group having 5 to 30 carbon atoms.

$Ar^1$ and $Ar^2$ each independently represent a substituted or unsubstituted aryl group having 6 to 30 carbon atoms or a substituted or unsubstituted alkenyl group. The substituent in the above groups is a substituted or unsubstituted alkyl group having 1 to 20 carbon atoms, a substituted or unsubstituted alkoxy groups having 1 to 20 carbon atoms, a substituted or unsubstituted aryloxy group having 6 to 30 carbon atoms, a substituted or unsubstituted alkylthio group having 1 to 20 carbon atoms, a substituted or unsubstituted arylthio group having 6 to 30 carbon atoms, a substituted or unsubstituted arylalkyl group having 7 to 30 carbon atoms, an unsubstituted single ring group having 5 to 30 carbon atoms, a substituted or unsubstituted condensed multi-ring group having 10 to 30 carbon atoms or a substituted or unsubstituted heterocyclic group having 5 to 30 carbon atoms.

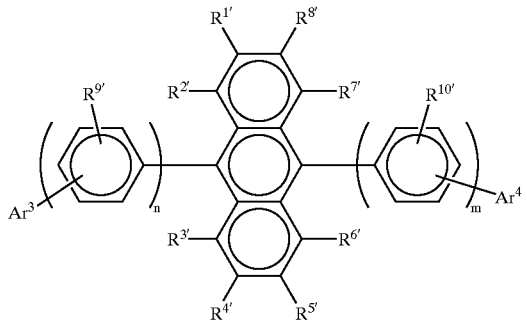

[ii]

In the above general formula, $R^{1\prime}$ to $R^{10\prime}$ each independently represent hydrogen atom, a halogen atom, cyano group, nitro group, a substituted or unsubstituted alkyl group having 1 to 20 carbon atoms, a substituted or unsubstituted alkoxy group having 1 to 20 carbon atoms, a substituted or unsubstituted aryloxy group having 6 to 30 groups, a substituted or unsubstituted alkylthio group having 1 to 20 carbon atoms, a substituted or unsubstituted arylthio group having 6 to 30 carbon atoms, a substituted or unsubstituted arylalkyl group having 7 to 30 carbon atoms, an unsubstituted single ring group having 5 to 30 carbon atoms, a substituted or unsubstituted condensed multi-ring group having 10 to 30 carbon atoms or a substituted or unsubstituted heterocyclic group having 5 to 30 carbon atoms.

$Ar^3$ and $Ar^4$ each independently represent a substituted or unsubstituted aryl group having 6 to 30 carbon atoms or a substituted or unsubstituted alkenyl group. The substituent in the above groups is a substituted or unsubstituted alkyl group having 1 to 20 carbon atoms, a substituted or unsubstituted alkoxy groups having 1 to 20 carbon atoms, a substituted or unsubstituted aryloxy group having 6 to 30 carbon atoms, a substituted or unsubstituted alkylthio group having 1 to 20 carbon atoms, a substituted or unsubstituted arylthio group having 6 to 30 carbon atoms, a substituted or unsubstituted arylalkyl group having 7 to 30 carbon atoms, an unsubstituted single ring group having 5 to 30 carbon atoms, a substituted or unsubstituted condensed multi-ring group having 10 to 30 carbon atoms or a substituted or unsubstituted heterocyclic group having 5 to 30 carbon atoms or a substituted or unsubstituted alkenyl group having 4 to 40 carbon atoms.

n represents a number of 1 to 3, m represents a number of 1 to 3 and $n+m \geq 2$.

[iii]

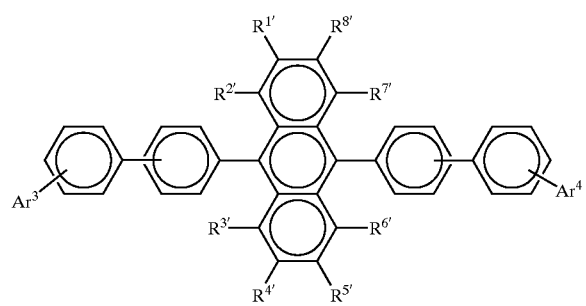

In the above general formula [ii], $R^{1\prime}$ to $R^{8\prime}$ each independently represent hydrogen atom, a halogen atom, cyano group, nitro group, a substituted or unsubstituted alkyl group having 1 to 20 carbon atoms, a substituted or unsubstituted alkoxy group having 1 to 20 carbon atoms, a substituted or unsubstituted aryloxy group having 6 to 30 groups, a substituted or unsubstituted alkylthio group having 1 to 20 carbon atoms, a substituted or unsubstituted arylthio group having 6 to 30 carbon atoms, a substituted or unsubstituted arylalkyl group having 7 to 30 carbon atoms, an unsubstituted single ring group having 5 to 30 carbon atoms, a substituted or unsubstituted condensed multi-ring group having 10 to 30 carbon atoms or a substituted or unsubstituted heterocyclic group having 5 to 30 carbon atoms.

$Ar^3$ and $Ar^4$ each independently represent a substituted or unsubstituted aryl group having 6 to 30 carbon atoms or a substituted or unsubstituted alkenyl group. The substituent in the above groups is a substituted or unsubstituted alkyl group having 1 to 20 carbon atoms, a substituted or unsubstituted alkoxy groups having 1 to 20 carbon atoms, a substituted or unsubstituted aryloxy group having 6 to 30 carbon atoms, a substituted or unsubstituted alkylthio group having 1 to 20 carbon atoms, a substituted or unsubstituted arylthio group having 6 to 30 carbon atoms, a substituted or unsubstituted arylalkyl group having 6 to 30 carbon atoms, an unsubstituted single ring group having 5 to 30 carbon atoms, a substituted or unsubstituted condensed multi-ring group having 10 to 30 carbon atoms, a substituted or unsubstituted heterocyclic group having 5 to 30 carbon atoms or a substituted or unsubstituted alkenyl group having 4 to 40 carbon atoms.

[iv]

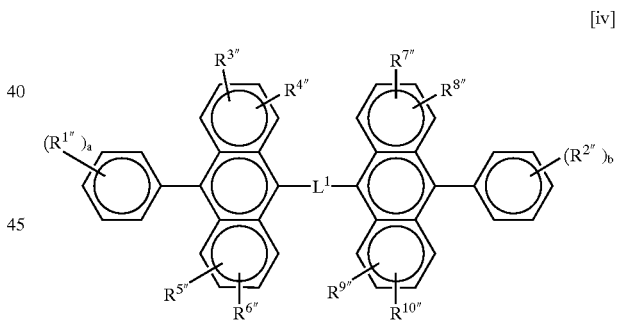

In the above general formula, $R^{1\prime\prime}$ to $R^{10\prime\prime}$ each independently represent hydrogen atom, an alkenyl group, an alkyl group, a cycloalkyl group, an aryl group which may be substituted, an alkoxy group, an aryloxy group, an alkylamino group, an arylamino group or a heterocyclic group which may be substituted. a and b each represent an integer of 1 to 5 and, when any of a and b represents an integer of 2 or greater, a plurality of $R^{1\prime\prime}$ or $R^{2\prime\prime}$ may represent the same or different groups, a plurality of groups represented by $R^{1\prime\prime}$ or $R^{2\prime\prime}$ may be bonded to each other to form a ring, and a pair of groups represented by $R^{3\prime\prime}$ and $R^{4\prime\prime}$, $R^{5\prime\prime}$ and $R^{6\prime\prime}$, $R^{7\prime\prime}$ and $R^{8\prime\prime}$ or $R^{9\prime\prime}$ and $R^{10\prime\prime}$ may form a ring via the bonding within the pair. $L^1$ represents a single bond, —O—, —S—, —N(R)—, R representing an alkyl group or an aryl group which may be substituted, or an arylene group.

[v]

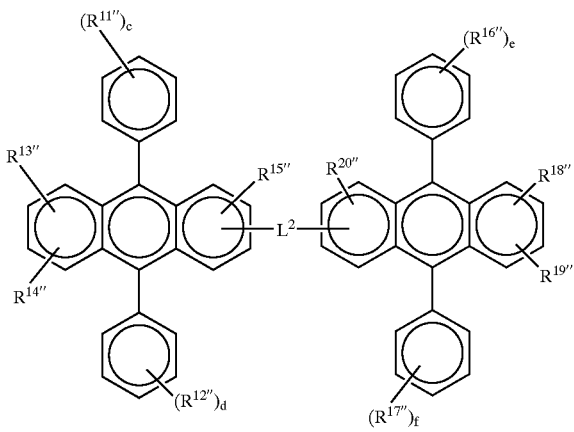

In the above general formula, $R^{11"}$ to $R^{20"}$ each independently represent hydrogen atom, an alkenyl group, an alkyl group, a cycloalkyl group, an aryl group, an alkoxy group, an aryloxy group, an alkylamino group, an arylamino group or a heterocyclic group which may be substituted. c, d, e and f each represent an integer of 1 to 5 and, when any of c, d, e and f represents an integer of 2 or greater, a plurality of $R^{11"}$, $R^{12"}$, $R^{16"}$ or $R^{17"}$ may represent the same or different groups, a plurality of groups represented by $R^{11"}$, $R^{12"}$, $R^{16"}$ or $R^{17"}$ may be bonded to each other to form a ring and a pair of groups represented by $R^{13"}$ and $R^{14"}$ or $R^{18"}$ and $R^{19"}$ may form a ring via the bonding within the pair. $L^2$ represents a single bond, —O—, —S—, —N(R)—, R representing an alkyl group or an aryl group which may be substituted, or an arylene group.

[vi]

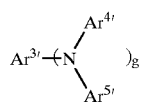

In the above general formula, $Ar^{3'}$, $Ar^{4'}$ and $Ar^{5'}$ each independently represent a substituted or unsubstituted monovalent aromatic group having 6 to 40 carbon atoms, at least one of the groups represented by $Ar^{3'}$ to $Ar^{5'}$ may have a styryl group and g represents an integer of 1 to 4.

[vii]

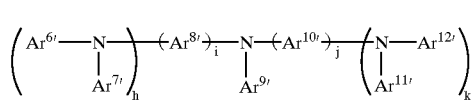

In the above general formula, $Ar^{6'}$, $Ar^{7'}$, $Ar^{9'}$, $Ar^{11'}$ and $Ar^{12'}$ each independently represent a substituted or unsubstituted monovalent aromatic group having 6 to 40 carbon atoms, $Ar^{8'}$ and $Ar^{10'}$ each independently represent a substituted or unsubstituted divalent aromatic group having 6 to 40 carbon atoms, at least one of the groups represented by $Ar^{6'}$ to $Ar^{12'}$ may have styryl group or styrylene group and h and k each represent an integer of 0 to 2.

It is preferable that the above fluorescent dopant emitting blue light is at least one compound selected from styrylamines, styryl compounds substituted with an amine and compounds having a condensed aromatic ring.

Examples of the above styrylamine and the above styryl compound substituted with an amine include compounds represented by general formulae [viii] and [ix] shown below. Examples of the above compound having a condensed aromatic ring include compounds represented by general formula [x] shown below.

[viii]

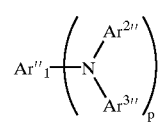

In the above general formula, $Ar^{1"}$, $Ar^{2'}$ and $Ar^{3"}$ each independently represent a substituted or unsubstituted arylene group having 6 to 40 carbon atoms, at least one of the groups represented by $Ar^{1'}$ to $Ar^{3"}$ has styryl group and p represents an integer of 1 to 3.

[ix]

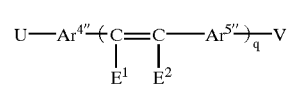

In the above general formula, $Ar^{4"}$ and $Ar^{5"}$ each independently represent an arylene group having 6 to 30 carbon atoms, $E^1$ and $E^2$ each independently represent an aryl group having 6 to 30 carbon atoms, an alkyl group, hydrogen atom or cyano group, q represents an integer of 1 to 3 and at least one of U and V represents a substituent having an amino group. It is preferable that the amino group is an arylamino group.

[x]

In the above general formula, A represents an alkyl group or an alkoxy group having 1 to 16 carbon atoms, a substituted or unsubstituted aryl group having 6 to 30 carbon atoms, a substituted or unsubstituted alkylamino group having 6 to 30 carbon atoms or a substituted or unsubstituted arylamino group having 6 to 30 carbon atoms, B represents a condensed aromatic ring group having 10 to 40 carbon atoms and r represents an integer of 1 to 4.

The present invention will be described more specifically with reference to examples in the following. However, the present invention is not limited to the examples.

EXAMPLE 1

Preparation of an Organic EL Device (An Example of the First Construction: the Fluoranthene Skeleton Structure)

A glass substrate of 25 mm×75 mm×1.1 mm thickness having a transparent electrode line of ITO (In—Sn—O) (manufactured by GEOMATEC Company) was cleaned with isopropyl alcohol for 5 minutes under application of ultrasonic wave and treated by the UV ozone cleaning for 30 minutes. The cleaned glass substrate having a transparent electrode line was attached to a substrate holder in a vacuum vapor deposition apparatus. On the face of the substrate on which the transparent electrode line was disposed, a film of N,N'-bis(N,N'-diphenyl-4-aminphenyl)-N,N-diphenyl-4,4'-diamino-1,1'-biphenyl (a TPD232 film) having a thickness of 60 nm was formed in a manner such that the film covered the transparent electrode line. The TPD232 film worked as the hole injecting layer. Then, a film of 4,4'-bis[N-(1-naphthyl)-N-phenylamino]biphenyl (an NPD film) having a thickness of 20 nm was formed on the TPD232 film. The NPD film worked as the hole transporting layer. On the NPD film, a styryl derivative DPVBi having the structure shown below and a fluorescent compound E1 having the structure also shown below (the peak wavelength of fluorescence: 565 nm) were vapor deposited in amounts such that the ratio of the amounts by weight was 40:0.04 and a film having a thickness of 40 nm was formed. This film worked as the light emitting layer emitting white light. On the film formed above, a film of tris(8-quinolinol)aluminum (an Alq film) having a thickness of 20 nm was formed. The Alq film worked as the electron injecting layer. Subsequently, Li (lithium, manufactured by SAES GETTERS Company) and Alq were binary vapor deposited and an Alq:Li film was formed as the electron injecting layer (a cathode). On the formed Alq:Li film, aluminum metal was vapor deposited and a metal cathode was formed. Thus, an organic EL device was formed.

The properties of the obtained organic EL device were evaluated. A direct voltage of 5 V was applied in a condition such that the ITO anode was connected to the positive electrode (+) and the aluminum cathode was connected to the negative electrode (−). White light was emitted at a luminance of 181 cd/m², a maximum luminance of 110,000 cd/m² and an efficiency of light emission of 8.8 cd/A. The chromaticity coordinates were (0.36, 0.32) and emission of white light could be confirmed. The life was as long as 1,800 hours when the device was driven under a constant current driving at an initial luminance of 1,000 cd/m².

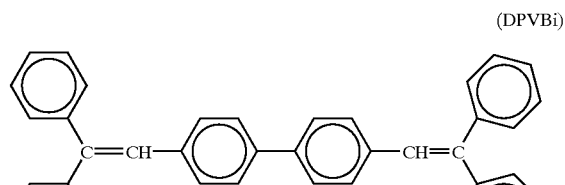

(DPVBi)

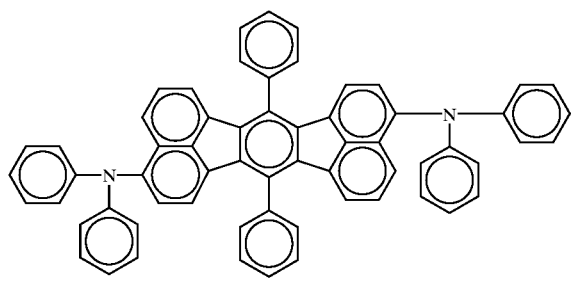

(E1)

EXAMPLE 2

Preparation of an Organic EL Device (An Example of the Second Construction: the Fluoranthene Skeleton Structure)

A glass substrate of 25 mm×75 mm×1.1 mm thickness having a transparent electrode line of ITO (In—Sn—O) (manufactured by GEOMATEC Company) was cleaned with isopropyl alcohol for 5 minutes under application of ultrasonic wave and treated by the UV ozone cleaning for 30 minutes. The cleaned glass substrate having a transparent electrode line was attached to a substrate holder in a vacuum vapor deposition apparatus. On the face of the substrate on which the transparent electrode line was disposed, a TPD232 film having a thickness of 60 nm was formed in a manner such that the film covered the transparent electrode line. The TPD232 film worked as the hole injecting layer. Then, an NPD film having a thickness of 20 nm was formed on the TPD232 film. When the NPD film was formed, the fluorescent compound described above (E1) was added in an amount such that the amounts by weight of NPD to E1 was 20:0.1. The NPD film worked as the light emitting layer emitting yellowish orange light and having the hole transporting property. On the NPD film, a film of DPVBi having a thickness of 40 nm was formed as the light emitting layer emitting blue light. On the film formed above, an Alq film having a thickness of 20 nm was formed. The Alq film worked as the electron injecting layer. Subsequently, Li (lithium, manufactured by SAES GETTERS Company) and Alq were binary vapor deposited and an Alq:Li film was formed as the electron injecting layer (a cathode). On the formed Alq:Li film, aluminum metal was vapor deposited and a metal cathode was formed. Thus, an organic EL device was formed.

The properties of the obtained organic EL device were evaluated. A direct voltage of 5 V was applied in a condition such that the ITO anode was connected to the positive electrode (+) and the aluminum cathode was connected to the negative electrode (−). White light was emitted at a luminance of 151 cd/m², a maximum luminance of 80,000 cd/m² and an efficiency of light emission of 6.8 cd/A. The life was as long as 1,100 hours when the device was driven under a constant voltage at an initial luminance of 1,000 cd/m².

EXAMPLE 3

Preparation of an Organic EL Device (An Example of the Third Construction: the Fluoranthene Skeleton Structure)

A glass substrate of 25 mm×75 mm×1.1 mm thickness having a transparent electrode line of ITO (In—Sn—O) (manufactured by GEOMATEC Company) was cleaned with isopropyl alcohol for 5 minutes under application of ultrasonic wave and treated by the UV ozone cleaning for 30 minutes. The cleaned glass substrate having a transparent electrode line was attached to a substrate holder in a vacuum vapor deposition apparatus. On the face of the substrate on which the transparent electrode line was disposed, a TPD232 film having a thickness of 60 nm was formed in a manner such that the film covered the transparent electrode line. The TPD232 film worked as the hole injecting layer. Then, an NPD film having a thickness of 20 nm was formed on the TPD232 film. The NPD film worked as the hole transporting layer. On the NPD film, the fluorescent compound (E1) described above was vapor deposited and a film having a thickness of 3 nm was formed. This film worked as the layer of a fluorescent compound and emitted orange light. On the thus formed film, a styryl derivative DPVBi was vapor deposited and a film having a thickness of 40 nm was formed. This film worked as the light emitting layer emitting blue light. On the film formed above, an Alq film having a thickness of 20 nm was formed. The Alq film worked as the electron injecting layer. Subsequently, Li (lithium, manufactured by SAES GETTERS Company) and Alq were binary vapor deposited and an Alq:Li film was formed as the electron injecting layer (a cathode). On the formed Alq:Li film, aluminum metal was vapor deposited and a metal cathode was formed. Thus, an organic EL device was formed.

The properties of the obtained organic EL device were evaluated. A direct voltage of 5 V was applied in a condition such that the ITO anode was connected to the positive electrode (+) and the aluminum cathode was connected to the negative electrode (−). White light was emitted at a luminance of 131 cd/m$^2$, a maximum luminance of 60,000 cd/m$^2$ and an efficiency of light emission of 5.8 cd/A. The life was as long as 1,400 hours when the device was driven under a constant voltage at an initial luminance of 1,000 cd/m$^2$.

EXAMPLE 4

Preparation of an Organic EL Device (An Example of Adding a Hole Transporting Material to the Light Emitting Layer)

A glass substrate of 25 mm×75 mm×1.1 mm thickness having a transparent electrode line of ITO (In—Sn—O) (manufactured by GEOMATEC Company) was cleaned with isopropyl alcohol for 5 minutes under application of ultrasonic wave and treated by the UV ozone cleaning for 30 minutes. The cleaned glass substrate having a transparent electrode line was attached to a substrate holder in a vacuum vapor deposition apparatus. On the face of the substrate on which the transparent electrode line was disposed, a TPD232 film having a thickness of 60 nm was formed in a manner such that the film covered the transparent electrode line. The TPD232 film worked as the hole injecting layer. Then, an NPD film having a thickness of 20 nm was formed on the TPD232 film. The NPD film worked as the hole transporting layer. On the NPD film, the fluorescent compound described above (El), NPD as the hole transporting material and a styryl derivative DPVBi as the material emitting blue light were mixed in amounts such that the ratio of the amounts by weight was 20:20:0.04 and a film was formed from the mixture. This film worked as the light emitting layer emitting white light. On the film formed above, an Alq film having a thickness of 20 nm was formed. The Alq film worked as the electron injecting layer. Subsequently, Li (lithium, manufactured by SAES GETTERS Company) and Alq were binary vapor deposited and an Alq:Li film was formed as the electron injecting layer (a cathode). On the formed Alq:Li film, aluminum metal was vapor deposited and a metal cathode was formed. Thus, an organic EL device was formed.

The properties of the obtained organic EL device were evaluated. A direct voltage of 5 V was applied in a condition such that the ITO anode was connected to the positive electrode (+) and the aluminum cathode was connected to the negative electrode (−). White light was emitted at a luminance of 131 cd/m$^2$, a maximum luminance of 120,000 cd/m$^2$ and an efficiency of light emission of 8.0 cd/A. The life was as long as 2,000 hours when the device was driven under a constant voltage at an initial luminance of 1,000 cd/m$^2$.

EXAMPLE 5

Preparation of an Organic EL Device (An Example of the First Construction: the Pentacene Skeleton Structure)

An organic EL device was prepared in accordance with the same procedures as those conducted in Example 1 except that a styryl derivative DPVBi, PAVB having the structure shown below as the fluorescent dopant emitting blue light and a fluorescent compound F1 having the structure shown below (the peak wavelength of fluorescence: 595 nm) were vapor deposited on the NPD film in amounts such that the ratio of the amounts by weight was 40:1:0.05 and a film having a thickness of 40 nm was formed.

The properties of the obtained organic EL device were evaluated. A direct voltage of 6 V was applied in a condition such that the ITO anode was connected to the positive electrode (+) and the aluminum cathode was connected to the negative electrode (−). White light was emitted at a luminance of 319 cd/m$^2$, a maximum luminance of 100,000 cd/m$^2$ and an efficiency of light emission of 7.28 cd/A. The chromaticity coordinates were (0.33, 0.34) and emission of white light could be confirmed. The life was as long as 3,500 hours when the device was driven under a constant voltage at an initial luminance of 1,000 cd/m$^2$.

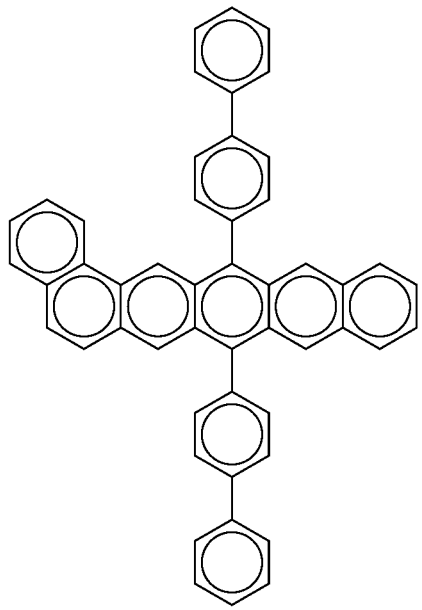

(F1)

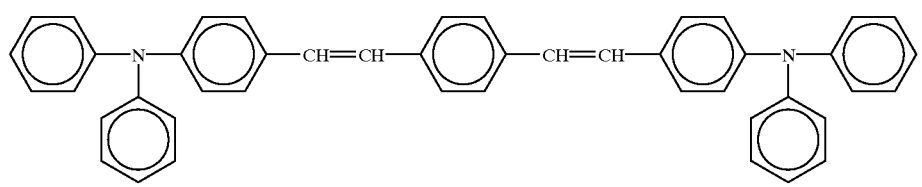

(PAVB)

EXAMPLE 6

Preparation of an Organic EL Device (An Example of the Second Construction: the Pentacene Skeleton Structure)

A glass substrate of 25 mm×75 mm×1.1 mm thickness having a transparent electrode line of ITO (In—Sn—O) (manufactured by GEOMATEC Company) was cleaned with isopropyl alcohol for 5 minutes under application of ultrasonic wave and treated by the UV ozone cleaning for 30 minutes. The cleaned glass substrate having a transparent electrode line was attached to a substrate holder in a vacuum vapor deposition apparatus. On the face of the substrate on which the transparent electrode line was disposed, a TPD232 film having a thickness of 60 nm was formed in a manner such that the film covered the transparent electrode line. The TPD232 film worked as the hole injecting layer. Then, an NPD film having a thickness of 20 nm was formed on the TPD232 film. On the NPD film, a styryl derivative DPVBi and a fluorescent compound (F1) were vapor deposited in amounts such that the ratio of the amounts by weight was 2:0.026 and a film having a thickness of 2 nm was formed. This film worked as the light emitting layer emitting orange light. On the formed film, the styryl derivative DPVBi and PAVB as the fluorescent dopant emitting blue light were vapor deposited in amount such that the ratio of the amount by weight was 38:1 and a film having a thickness of 38 nm was formed. This film worked as the light emitting layer emitting blue light. On the film formed above, an Alq film having a thickness of 20 nm was formed. The Alq film worked as the electron injecting layer. Subsequently, Li (lithium, manufactured by SAES GETTERS Company) and Alq were binary vapor deposited and an Alq:Li film was formed as the electron injecting layer (a cathode). On the formed Alq:Li film, aluminum metal was vapor deposited and a metal cathode was formed. Thus, an organic EL device was formed.

The properties of the obtained organic EL device were evaluated. A direct voltage of 5.5 V was applied in a condition such that the ITO anode was connected to the positive electrode (+) and the aluminum cathode was connected to the negative electrode (−). White light was emitted at a luminance of 233 cd/m$^2$, a maximum luminance of 80,000 cd/m$^2$ and an efficiency of light emission of 6.85 cd/A. The life was as long as 2,100 hours when the device was driven under a constant voltage at an initial luminance of 1,000 cd/m$^2$.

COMPARATIVE EXAMPLE 1

An organic EL device was prepared in accordance with the same procedures as those conducted in Example 1 except that rubrene which is generally used as a fluorescent compound emitting orange light was used in place of the fluorescent compound (E1).

The properties of the obtained organic EL device were evaluated. A direct voltage of 6 V was applied in a condition such that the ITO anode was connected to the positive electrode (+) and the aluminum cathode was connected to the negative electrode (−). White light was emitted at a luminance of 140 cd/m$^2$, a maximum luminance of 60,000 cd/m² and an efficiency of light emission of 4.0 cd/A. The efficiency of light emission was markedly inferior to those obtained in Examples. The life was as short as 560 hours when the device was driven under a constant voltage at an initial luminance of 1,000 cd/m².

Industrial Applicability

As described above in detail, the organic EL device of the present invention emits white light and has an efficiency of light emission as high as 5 lumen/W or greater and 5 cd/A or greater and a life as long as 10,000 hours or longer under the condition of ordinary use. Thus, the organic EL device exhibits properties sufficient for practical applications. The organic EL device is advantageously used as the light emitting device in various types of display apparatuses.

What is claimed is:

1. An organic electroluminescence device emitting white light which comprises a pair of electrodes and a layer of a light emitting medium disposed between the pair of electrodes, wherein the layer of a light emitting medium comprises a light emitting material emitting blue light and a fluorescent compound having at least one structure selected from a fluoranthene skeleton structure and a pentacene skeleton structure.

2. An organic electroluminescence device emitting white light according to claim 1, wherein the layer of a light emitting medium contacts an anode and comprises an oxidizing agent.

3. An organic electroluminescence device emitting white light according to claim 1, wherein the layer of a light emitting medium contacts a cathode and comprises a reducing agent.

4. An organic electroluminescence device emitting white light according to claim 1, wherein the fluorescent compound is selected from the group consisting of the following compounds (1), (2), (3), (4), (5), (6), (7), (8), (9), (10), (11), (14), (15), (16), (17), (18), (19), (20), (1') and (2'):

(1)
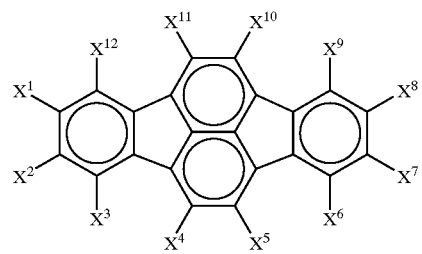

(2)
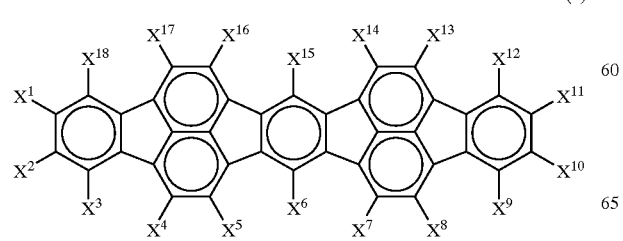

-continued (3)
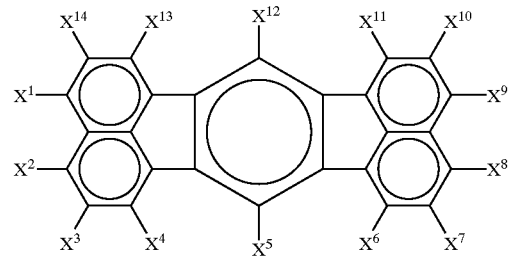

(4)
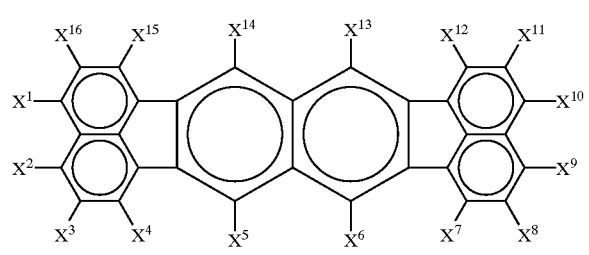

(5)
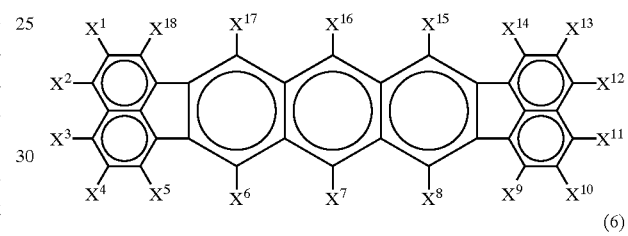

(6)
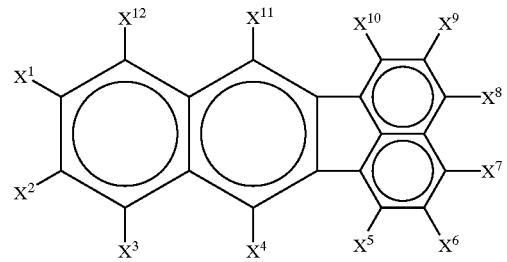

(7)
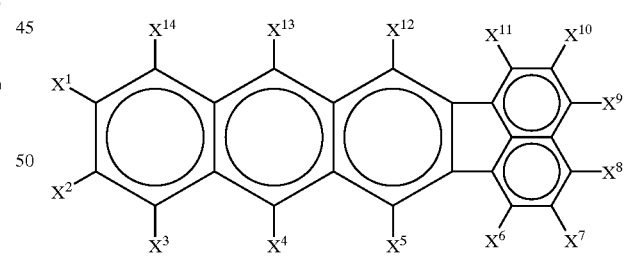

(8)
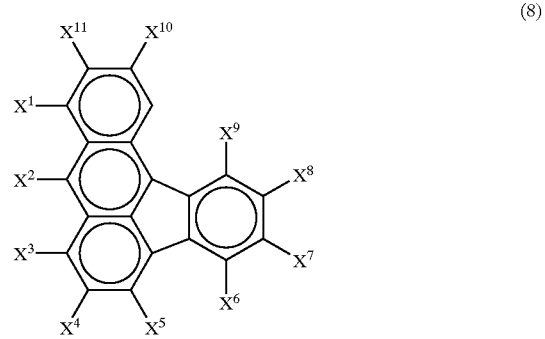

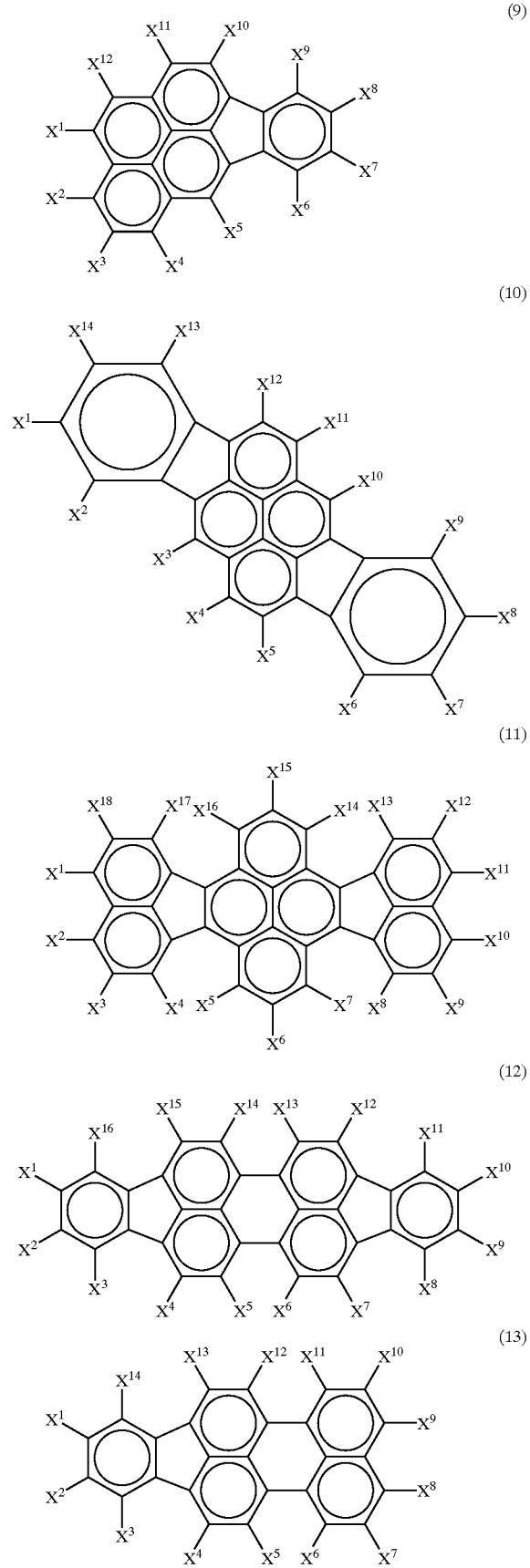

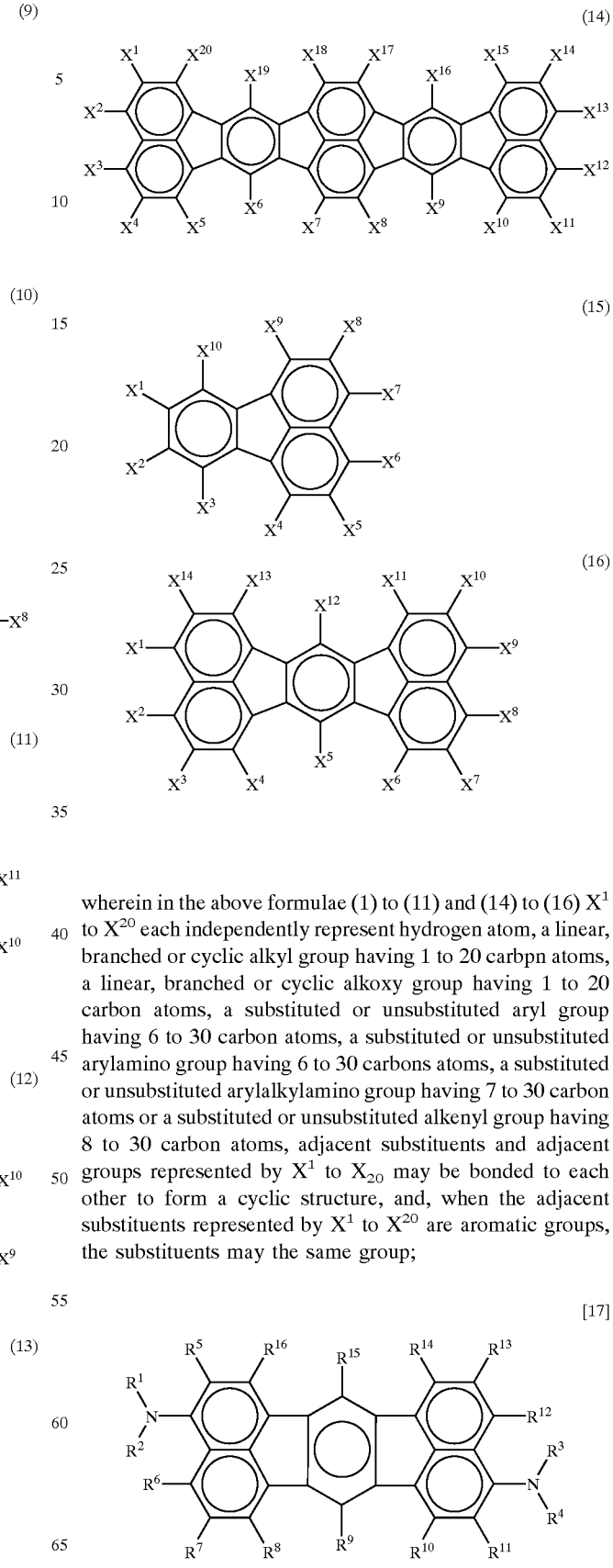

wherein in the above formulae (1) to (11) and (14) to (16) $X^1$ to $X^{20}$ each independently represent hydrogen atom, a linear, branched or cyclic alkyl group having 1 to 20 carbpn atoms, a linear, branched or cyclic alkoxy group having 1 to 20 carbon atoms, a substituted or unsubstituted aryl group having 6 to 30 carbon atoms, a substituted or unsubstituted arylamino group having 6 to 30 carbons atoms, a substituted or unsubstituted arylalkylamino group having 7 to 30 carbon atoms or a substituted or unsubstituted alkenyl group having 8 to 30 carbon atoms, adjacent substituents and adjacent groups represented by $X^1$ to $X_{20}$ may be bonded to each other to form a cyclic structure, and, when the adjacent substituents represented by $X^1$ to $X^{20}$ are aromatic groups, the substituents may the same group;

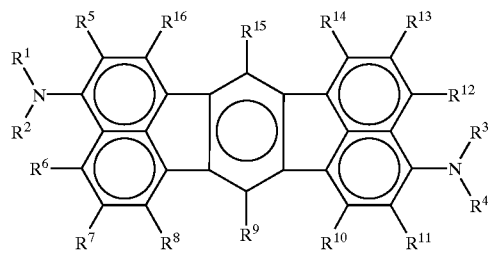

-continued

[18]

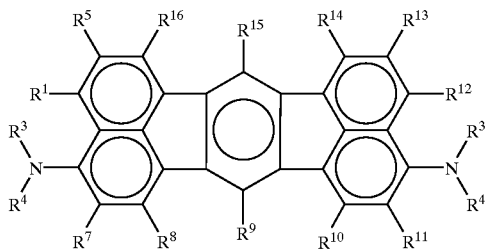

wherein in the above formulae (17) and (18), $R^1$ to $R^4$ each independently represent an alkyl group having 1 to 20 carbon atoms, a substituted or unsubstituted aryl group having 6 to 30 carbon atoms, any of a pair of groups represented by $R^1$ to $R^2$ and a pair of groups represented by $R^3$ and $R^4$ may be bonded to each other through a carbon-carbon bond, —O— or —S—,$R^5$ to $R^{16}$ each independently represent hydrogen atom, a linear, branched or cyclic alkyl group having 1 to 20 carbon atoms, a linear, branched or cyclic alkoxy group having 1 to 20 carbon atoms, a substituted or unsubstituted aryl group having 6 to 30 carbon atoms, a substituted or unsubstituted aryloxy group having 6 to 30 carbon atoms, a substituted or unsubstituted aryloxy group having 6 to 30 carbon atoms, a substituted or unsubstituted alkylamino group having 1 to 30 carbon atoms, a substituted or unsubstituted arylalkylamino group having 7 to 30 carbon atoms or a substituted alkenyl group having 8 to 30 carbon atoms, and adjacent substituents and adjacent groups represented by $R^5$ to $R^{16}$ may be bonded to each other to form a cyclic structure;

[19]

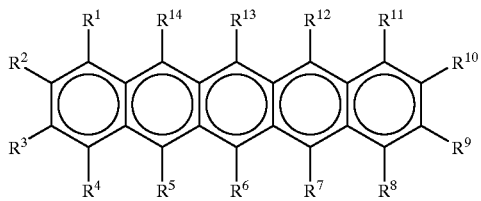

wherein in the above formula (19),$R^1$ to $R^{14}$ each independently represent hydrogen atom, an alkyl group having 1 to 10 carbon atoms, an aryloxy group having 6 to 20 carbon atoms, an arylalkyl group having 6 to 20 carbon atoms, an aryl group having 6 to 30 carbon atoms, an arylamino group having 6 to 30 carbon atoms, an alkylamino group having 2 to 20 carbon atoms or an arylalkylamino group having 6 to 30 carbon atoms, the groups represented by $R^1$ to $R^{14}$ may be substituted, and at least one pair of groups represented by $R^1$ to $R^{14}$ which are adjacent to each other are not hydrogen atom and form a cyclic structure;

[20]

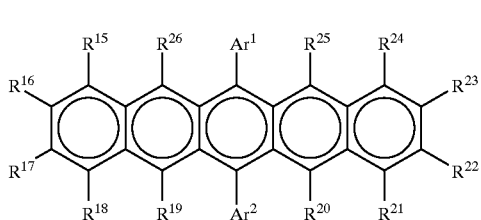

wherein in the above formula (20),$R^{15}$ to $R^{26}$ each independently represent hydrogen atom, an alkyl group having 1 to 10 carbon atoms, an aryloxy group having 6 to 20 carbon atoms, an arylalkyl group having 6 to 20 carbon atoms, an aryl group having 6 to 30 carbon atoms, an arylamino group having 6 to 30 carbon atoms, an alkylamino group having 2 to 20 carbon atoms or an arylalkylamino group having 6 to 30 carbon atoms, the groups represented by $R^{15}$ to $R^{26}$ may be substituted, at least one pair of groups represented by $R^{15}$ to $R^{26}$ which are adjacent to each other are not hydrogen atom and form a cyclic structure, and $Ar^1$ and $Ar^2$ each represent a substituted or unsubstituted aryl group having 6 to 30 carbon atoms or a substituted or unsubstituted heterocyclic group having 5 to 30 carbon atoms;

$$X=Z=Y \quad (1')$$

$$X=W \quad (2')$$

wherein in the above formulae (1') and (2'), Z represents a tetravalent group represented by any of the following general formulae (1) to (6):

(1)

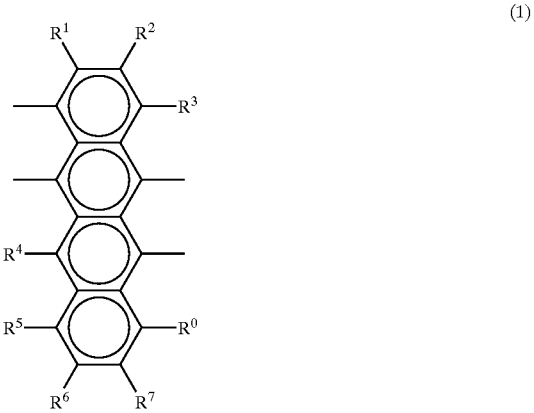

(2)

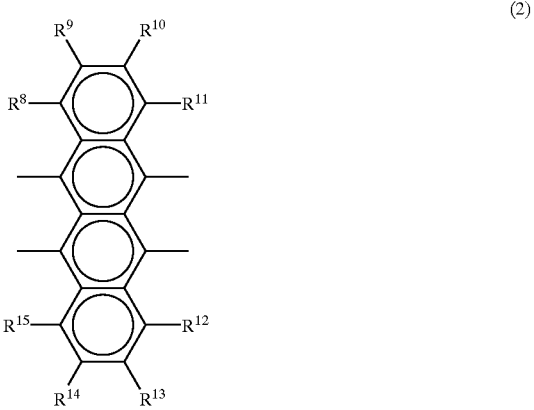

(3)

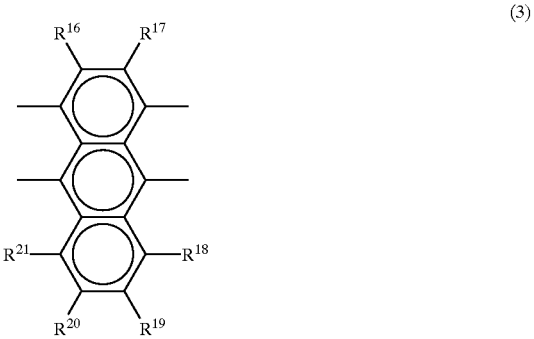

(4)
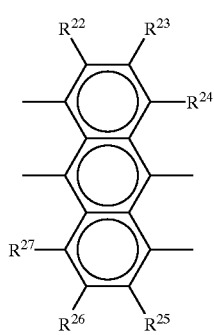
(5)
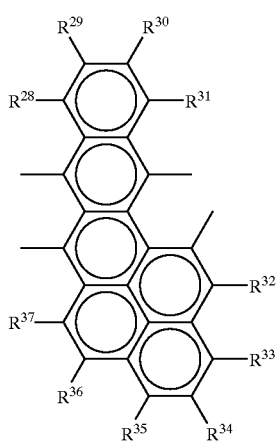
(6)
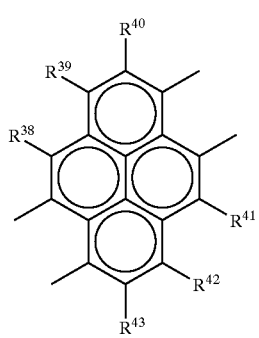
wherein in the above formulae (1') and (2'), X and Y each independently represent a divalent group represented by any of the following formulae (7) to (10):
(7)
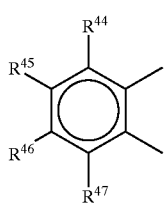
(8)
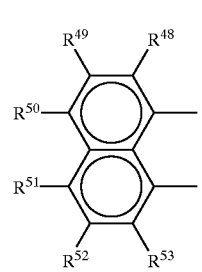
(9)
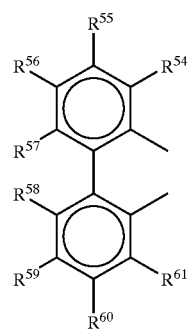
(10)
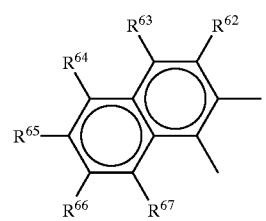
and in the above formulae (1') and (2'), W represents a divalent group represented by any of the following formulae (11) to (13):
(11)
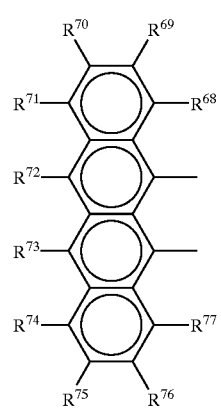

-continued

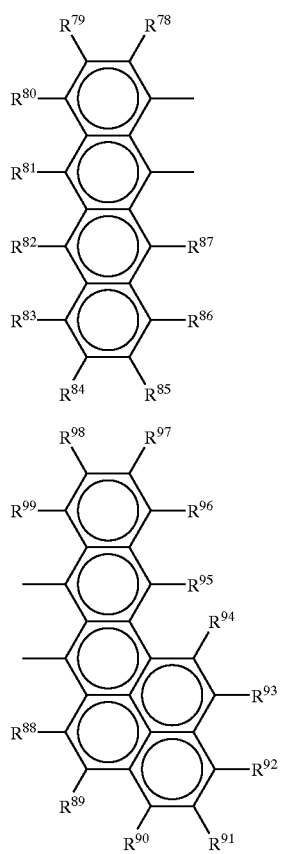

(12)

(13)

wherein in the above formulae (1) to (13) for X, Y and Z under formuae (1') and (2'), $R^0$ to $R^{99}$ each independently represent hydrogen atom, a halogen atom, cyano group, a substituted or unsubstituted alkyl group having 1 to 20 carbon atoms, a substituted or unsubstituted cycloalkyl group having 6 to 10 carbon atoms, a substituted or unsubstituted alkoxy group having 1 to 20 carbon atoms, a substitued or unsubstituted amino group having 1 to 30 carbon atoms, a substituted or unsubstituted aryloxy group having 6 to 20 carbon atoms, a substituted or unsubstituted alkoxycarbonyl group having 1 to 20 carbon atoms, a substituted or unsubstituted aralkyl group having 6 to 30 carbon atoms, a substituted or unsubstituted aromatic hydrocarbon group having 6 to 30 carbon atoms or a substituted or unsubstituted heterocyclic group having 5 to 30 carbon atoms, and adjacent groups represented by $R^0$ to $R^{99}$ may be boned to each other to form a cyclic structure.

5. An organic electroluminescence device emitting white light according to claim 1, wherein the layer of a light emitting medium comprises a hole transporting material or hole injecting material.

6. An organic electroluminescence device emitting white light according to claim 1, wherein the layer of light emitting medium comprises a hole transporting layer or a hole injecting layer.

7. An organic electroluminescence device emitting white light according to claim 1, wherein the layer of light emitting medium comprises an electron transporting material or an electron injecting material.

8. An organic electroluminescence device emitting white light according to claim 1, wherein the layer of light emitting medium comprises an electron transporting layer or an electron injecting material.

9. An organic electroluminescence device emitting white light according to claim 1, wherein a layer of an inorganic compound is disposed between at least one of electrodes and the layer of light emitting medium.

10. An organic electroluminescence device emitting white light according to claim 1, wherein the fluroscent compound has an electrode-donating group.

11. An organic electroluminescence device emitting white light according to claim 1, wherein the fluorescent compound has a peak wavelenght of fluorescence at 540 to 650nm.

12. An organic electroluminescence device emitting white light according to claim 1, wherein the layer of a light emitting medium comprises light emitting layer A comprising the light emitting material emitting blue light and fluorescent compound.

13. An organic electroluminescence device emitting white light according to claim 12, wherein light emitting layer A further comprises a fluorescent dopant emitting blue light.

14. An organic electroluminescence device emitting white light according to claim 13, wherein the fluorescent dopant emitting blue light is at least one compound selected from styrylamines, styryl compounds substitued with an amine and compounds having a condensed aromatic ring.

15. An organic electroluminescence device emitting white light according to claim 1, wherein the layer of a light emitting medium comprises light emitting layer emitting blue light and light emitting layer A which comprises the light emitting material emitting blue light and the fluorescent compound.

16. An organic electroluminescence device emitting white light according to claim 15, wherein light emitting layer A further comprises a fluorescent dopant emitting blue light.

17. An organic electroluminescence device emitting white light according to claim 16, wherein the fluorescent dopant emitting blue light is at least one compound selected from styrylamined, styryl compounds substitued with an amine and compounds having a condensed aromatic ring.

18. An organic electroluminescence device emitting white light according to claim 15, wherein the light emitting layer emitting blue light further comprises a fluorescent dopant emitting blue light.

19. An organic electroluminescence device emitting white light according to claim 18, wherein the fluorescent dopant emitting blue light is at least one compound selected from styrylamines, styrl compounds substituted with an amine and compounds having a condensed aromatic ring.

20. An organic electroluminescence device emitting white light according to claim 1, wherein the layer of a light emitting meduim comprises a light emitting layer B comprising the light emitting material emitting blue light and a layer comprising the fluorescent compound.

21. An organic electroluminescence device emitting white light according to claim 20, wherein light emitting layer B furhter comprises a fluorescent dopant emitting blue light.

22. An organic electroluminescence device emitting white light according to claim 21, wherein the fluorescent dopant emitting blue light is at least one compound selected from styrylamines, styryl compounds substituted with an amine and compounds having a condensed aromatic ring. nitrogen atoms which are substituted with an aromatic group and having at least one alkenyl group.

23. An organic electroluminescence device emitting white light according to claim 1, wherein the light emitting material emmitting blue light is a styryl derivation, an antracene derivative or an aromatic amine.

24. An organic electroluminescence device emitting white light according to claim 23, wherein the styrly derivative is at least one compound selected from distyryl derivatives, tristyryl derivatives, tetraastyryl derivatives and styrylamine derivatives.

25. An organic electroluminescence device emitting white light according to claim 23, wherein the anthrance derivative is a compound having a phenylanthracene skeleton structure.

26. An organic electroluminescence device emitting white light according to claim 23, wherein the aromatic amine is a compound having 2 to 4 nitrogen atoms which are substituted with an aromatic group.

27. An organic electroluminescence device emitting white light according to claim 23, wherein the aromatic amine is a compound having 2 to 4 nitrogen atoms which are substituted with an aromatic group and having at least one alkenyl group.

* * * * *

UNITED STATES PATENT AND TRADEMARK OFFICE
CERTIFICATE OF CORRECTION

PATENT NO. : 6,803,120 B2
DATED : October 12, 2004
INVENTOR(S) : Fukuoka et al.

It is certified that error appears in the above-identified patent and that said Letters Patent is hereby corrected as shown below:

Title page,
Items [45] and [*] Notice, should read as follows:

-- [45] Date of Patent: *Oct. 12, 2004 --

[*] Notice: Subject to any disclaimer, the term of this patent is extended or adjusted under 35 U.S.C. 154(b) by 119 days.

This Patent is subject to a terminal disclaimer. --

Signed and Sealed this

Eighteenth Day of January, 2005

JON W. DUDAS
*Director of the United States Patent and Trademark Office*